(12) United States Patent
Koukitu et al.

(10) Patent No.: US 7,518,216 B2
(45) Date of Patent: Apr. 14, 2009

(54) GALLIUM NITRIDE BASEPLATE, EPITAXIAL SUBSTRATE, AND METHOD OF FORMING GALLIUM NITRIDE

(75) Inventors: Akinori Koukitu, Koganei (JP); Yoshinao Kumagai, Koganei (JP); Yoshiki Miura, Itami (JP); Kikurou Takemoto, Itami (JP); Fumitaka Sato, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 222 days.

(21) Appl. No.: 11/276,966

(22) Filed: Mar. 20, 2006

(65) Prior Publication Data
US 2007/0215982 A1  Sep. 20, 2007

(51) Int. Cl.
*H01L 29/20* (2006.01)
(52) U.S. Cl. .................................................. 257/615
(58) Field of Classification Search ................ 428/698; 257/6, 76, 615; 117/99
See application file for complete search history.

(56) References Cited

U.S. PATENT DOCUMENTS 4,689,094 A * 8/1987 Van Rees et al. ............... 117/99
7,170,095 B2 * 1/2007 Vaudo et al. .................. 257/76
2003/0157376 A1 * 8/2003 Vaudo et al. ................. 428/698

FOREIGN PATENT DOCUMENTS

| JP | H11-040897 A | 2/1999 |
| JP | 2007-534580 A | 11/2007 |
| WO | WO-02-04443 A1 | 6/2002 |

OTHER PUBLICATIONS

Robert P. Vaudo, et al., "Characteristics of semi-insulating, Fe-doped GaN substrates," Physica Status Solidi (a), 2003, pp. 18-21, vol. 200, Issue 1, Wiley-VCH Verlag GmbH & Co., Weinheim.
Sten Heikman, et al., "Growth of Fe doped semi-insulating GaN by metalorganic chemical vapor deposition," Applied Physics Letters, Jul. 15, 2002, pp. 439-441, vol. 81, No. 3, American Institute of Physics, New York.

(Continued)

*Primary Examiner*—Davienne Monbleau
*Assistant Examiner*—Monica D Harrison
(74) *Attorney, Agent, or Firm*—James W. Judge

(57) ABSTRACT

A method of forming an iron-doped gallium nitride for a semi-insulating GaN substrate is provided. A substrate 1, such as a sapphire substrate having the (0001) plane, is placed on a susceptor of a metalorganic hydrogen chloride vapor phase apparatus 11. Next, gaseous iron compound $G_{Fe}$ from a source 13 for an iron compound, such as ferrocene, and hydrogen chloride gas $G1_{HCl}$ from a hydrogen chloride source 15 are caused to react with each other in a mixing container 16 to generate gas $G_{FeComp}$ of an iron-containing reaction product, such as iron chloride ($FeCl_2$). In association with the generation, the iron-containing reaction product $G_{FeComp}$, first substance gas $G_N$ containing elemental nitrogen from a nitrogen source 17, and second substance gas $G_{Ga}$ containing elemental gallium are supplied to a reaction tube 21 to form iron-doped gallium nitride 23 on the substrate 1.

1 Claim, 6 Drawing Sheets

OTHER PUBLICATIONS

S. Heikman, et al., "Growth and characteristics of Fe-doped GaN," Journal of Crystal Growth, 2003, pp. 513-517, vol. 248, Elsevier Science B.V., North-Holland.

R. Heitz et al., "Excited States of Fe3+ in GaN," Physical Review B, Feb. 15, 1997, pp. 4382-4387, vol. 55, No. 7. The American Physical Society, NY.

Hisashi Murakami, "Growth of Semi-Insulating GaN Layer with High Fe Doping," Journal of the Japanese Association of Crystal Growth, Aug. 25, 2004, pp. 267, vol. 31, No. 3, The Japanese Association of Crystal Growth, Tokyo Japan.

* cited by examiner

GALLIUM NITRIDE BASEPLATE, EPITAXIAL SUBSTRATE, AND METHOD OF FORMING GALLIUM NITRIDE

BACKGROUND OF THE INVENTION

1. Technical Field

The present invention relates to semi-insulating gallium nitride baseplates and epitaxial substrates in which such gallium nitride baseplates are utilized, and to methods of forming gallium nitride into which iron has been introduced.

2. Description of the Related Art

In *Physica Status Solidi (a)*, Volume 200, Issue 1, 2003, pp. 18-21, an iron-doped GaN material is grown on a sapphire substrate using a hydride vapor phase epitaxy (HVPE) tool. An iron dopant is supplied in the form of iron chloride, which is formed by flowing HCl on metallic iron. The GaN sample having the highest resistance has an iron concentration of $4 \times 10^{16}$ cm$^{-3}$.

In *Applied Physics Letters*, Vol. 81, No. 3, 15 Jul., 2002, pp. 439-441, an iron-doped GaN layer is grown by metalorganic vapor phase deposition (MOCVD). An iron dopant is supplied in the form of ferrocene (Cp$_2$Fe: bis(cyclopentadienyl) iron) using a carrier gas (hydrogen). A GaN layer having a resistivity of $7 \times 10^9$ Ω/sq has a thickness of 2.6 micrometers.

Japanese Unexamined Pat. App. Pub. No. H11-40897 describes an InP semiconductor laser device. The semiconductor laser device has an iron-doped high-resistance InP semiconductor layer.

In recent years, attention has been given to GaN electronic devices as materials for achieving high-speed and high-breakdown-voltage devices. In general, a sapphire substrate and a silicon carbide (SiC) substrate are used as substrates for fabrication of the GaN electric device. It is essential to employ a semi-insulating substrate to reduce stray capacitance associated with the substrate, in order to achieve high-speed operation of the GaN electric device.

The above-described substrates have lattice constants which are significantly different from the lattice constants of an AlGaN layer and a GaN layer. For this reason, a number of dislocations occur in these semiconductor layers. Therefore, in order to fabricate a higher-breakdown-voltage device, it is preferable that a substrate (e.g., a GaN substrate or an AlN substrate) having a lattice constant close or equal to that of the above-described semiconductor layer be used. Concerning the GaN substrate, a conductive substrate has at last been made commercially available, but a semi-insulating GaN substrate is not yet available. Both the semi-insulating GaN and AlN substrates are under development.

In the above-cited *Physica Status Solidi (a)* article, an iron dopant is supplied in the form of iron chloride produced by flowing HCl on metallic iron. In this technique, iron oxide is present on the surface of the metallic iron, so that the reaction of hydrochloric acid and iron is unstable. This method should be modified in order to achieve stable fabrication. If H$_2$ is present in the carrier gas, the equilibrium of the following reaction is shifted to the left side, interfering with the formation of FeCl$_2$.

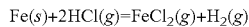

Therefore, as the carrier gas, an inert gas, such as N$_2$ or the like, should be used. On the other hand, metallic iron has a purity of about 5 N. When the metallic iron is used as an iron source, other impurities are doped along with iron.

In Pat. App. Pub. No. H11-40897, a high-resistance InP semiconductor film into which iron has been doped is grown by metalorganic vapor phase deposition using ferrocene. Also, in the *Applied Physics Letters* article, MOCVD is used to supply ferrocene into a reaction furnace using hydrogen carrier gas. In MOCVD, heating is performed only in the vicinity of a substrate.

However, when a thick GaN film is deposited on a substrate by VPE in which heating is performed using an external heater, ferrocene reacts with hydrogen in accordance with the following reaction.

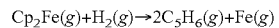

Iron generated by this decomposition forms droplets, so that the iron dopant does not appropriately reach the substrate. For this reason, it is not possible to fabricate a thick gallium nitride film for a semi-insulating GaN substrate having a high resistivity by iron doping.

BRIEF SUMMARY OF THE INVENTION

In view of the above-described situation, an object of the present invention is to provide a semi-insulating GaN substrate into which iron has been introduced, an epitaxial substrate utilizing the substrate, and a method of forming gallium nitride, into which iron has been introduced, for a semi-insulating GaN substrate.

According to an aspect of the present invention, a gallium nitride baseplate has an iron concentration of $5 \times 10^{16}$ cm$^{-3}$ or more and a thickness of 100 micrometers or more.

This gallium nitride baseplate affords a semi-insulating gallium nitride baseplate that can be used for semiconductor device fabrication.

In a gallium nitride baseplate of the present invention, the gallium nitride baseplate has a resistivity of $1 \times 10^5$ Ω·cm or more.

This gallium nitride baseplate can be utilized in semiconductor device fabrication, and affords a gallium nitride baseplate having a resistivity of $1 \times 10^5$ Ω·cm or more.

In a gallium nitride baseplate of the present invention, the gallium nitride baseplate has a resistivity of $1 \times 10^7$ Ω·cm or more.

This gallium nitride baseplate can be utilized in semiconductor device fabrication, and affords a gallium nitride baseplate having a resistivity of $1 \times 10^7$ Ω·cm or more.

In a gallium nitride baseplate of the present invention, the iron concentration is $1 \times 10^{21}$ cm$^{-3}$ or less.

By means of this gallium nitride baseplate, if the iron concentration is $1 \times 10^{21}$ cm$^{-3}$ or less, reduction in resistivity and degradation in crystallinity due to implanting of a large amount of iron are eliminated.

According to another aspect of the present invention, an epitaxial substrate comprises: (a) a gallium nitride baseplate having an iron concentration of $5 \times 10^{16}$ cm$^{-3}$ or more and a thickness of 100 micrometers or more; and (b) one or a plurality of III nitride films provided on the gallium nitride baseplate.

This epitaxial substrate can be utilized in semiconductor device fabrication and affords a gallium nitride baseplate that exhibits semi-insulative properties.

In an epitaxial substrate of the present invention, the gallium nitride baseplate has a resistivity of $1 \times 10^5$ Ω·cm or more.

This epitaxial substrate uses a gallium nitride baseplate whose resistivity is $1 \times 10^5$ Ω·cm or more, wherein an epitaxial substrate that can be utilized in semiconductor device fabrication is provided.

In an epitaxial substrate of the present invention, the gallium nitride baseplate has a resistivity of $1 \times 10^7$ Ω·cm or more.

This epitaxial substrate uses a gallium nitride baseplate whose resistivity is $1 \times 10^7$ Ω·cm or more, wherein an epitaxial substrate that can be utilized in semiconductor device fabrication is made available.

In an epitaxial substrate of the present invention, the iron concentration is $1 \times 10^{21}$ cm$^{-3}$ or less.

By means of this epitaxial substrate, if the iron concentration is $1 \times 10^{21}$ cm$^{-3}$ or less, reduction in resistivity and degradation in crystallinity due to implanting of a large amount of iron are avoided.

According to a still another aspect of the present invention, a method of forming for a gallium nitride baseplate gallium nitride into which iron has been introduced comprises the step of supplying an iron compound to form by hydride VPE or metalorganic hydrogen chloride VPE a gallium nitride region into which iron has been introduced.

According to this method, the iron compound is used without using metallic iron, making it possible to prevent impurities other than iron from being introduced into the gallium nitride region concomitantly with the iron doping. Since an iron compound is supplied using hydride VPE or metalorganic hydrogen chloride VPE, iron droplet generation is minimal, which furthers the provision of iron to the epitaxial region. Therefore, a gallium nitride region having a satisfactory semi-insulating property is formed.

In the method of the present invention, preferably, in the step of forming the gallium nitride region, organometallic iron is used as the iron compound.

This method makes advantageous use of organometallic iron.

In the method of the present invention, preferably, in the step of forming the gallium nitride region, at least one of Cp$_2$Fe (bis(cyclopentadienyl)iron, chemical formula: (C$_5$H$_5$)$_2$Fe) and MeCp$_2$Fe (bis(methylcyclopentadienyl) iron, chemical formula: (CH$_3$C$_5$H$_4$)$_2$Fe) is used as the organometallic iron.

In a preferable embodiment, Cp$_2$Fe (bis(cyclopentadienyl) iron) and MeCp$_2$Fe (bis(methylcyclopentadienyl)iron) are serviceable.

According to still another aspect of the present invention, a method of forming for a gallium nitride baseplate gallium nitride into which iron has been introduced comprises the steps of: (a) forming a reaction product containing iron by reacting a gaseous iron compound and hydrogen chloride gas; and (b) supplying into a reaction tube the reaction product gas, a first gas containing an elemental nitrogen, and a second gas containing elemental gallium, to form on a substrate a gallium nitride region into which iron has been introduced.

According to this method, a reaction product containing iron is generated from an iron compound and hydrogen chloride prior to supplying precursor gases into the reaction apparatus. Therefore, generation of iron droplets is minimized. In addition, it is possible to supply iron into the epitaxial region. Since an iron compound is used without using metallic iron, it is possible to prevent impurities other than iron from being introduced into the gallium nitride region concomitantly with the iron doping.

In the method of the present invention, preferably, in the step of forming the reaction product, at least one of Cp$_2$Fe (bis(cyclopentadienyl)iron, chemical formula: (C$_5$H$_5$)$_2$Fe) and MeCp$_2$Fe (bis(methylcyclopentadienyl)iron, chemical formula: (CH$_3$C$_5$H$_4$)$_2$Fe) is used as the iron compound.

In this method, preferably, in the step of creating the reaction product, the iron compound and the hydrogen chloride are reacted at a temperature of 300 Celsius degrees or more.

According to this method, it is preferable to cause the iron compound and the hydrogen chloride gas to react with each other at a temperature of 300 Celsius degrees or more in order to generate gaseous iron compound that is to be used concomitantly with first gas and second gas.

Also, in this method, preferably, in the step of forming the reaction product, the iron compound and the hydrogen chloride are caused to react with each other at a temperature of 1100 degrees Celsius or less.

This is because this temperature is an upper limit temperature under which a quartz tube can be stably used.

In the method of the present invention, preferably, the ratio ($P_{Fe}/P_{Ga}$) of the partial pressure ($P_{Fe}$) of the gaseous iron compound to the partial pressure ($P_{Ga}$) of the second gas is 0.01 or more.

By means of this method, a GaN epitaxial layer having a high resistivity is obtained without a reduction in the amount of iron taken into the epitaxial layer.

In the method of the present invention, preferably, H2 gas is used as the carrier gas for the iron compound and the gaseous iron compound. When H2 gas is used, the degree of convection in the reaction furnace is small compared to nitrogen gas. Therefore, the uniformity—that is, the surface morphology—of the grown film is improved.

As described above, the present invention affords gallium nitride baseplates into which iron has been introduced, epitaxial substrate utilizing the gallium nitride baseplates, and a method of producing gallium nitride, into which iron has been introduced, for a gallium nitride baseplate.

These and other objects, features, aspects and advantages of the present invention will become more apparent from the following detailed description of the present invention when taken in conjunction with the accompanying drawings.

DETAILED DESCRIPTION OF THE INVENTION

Figure 1A:
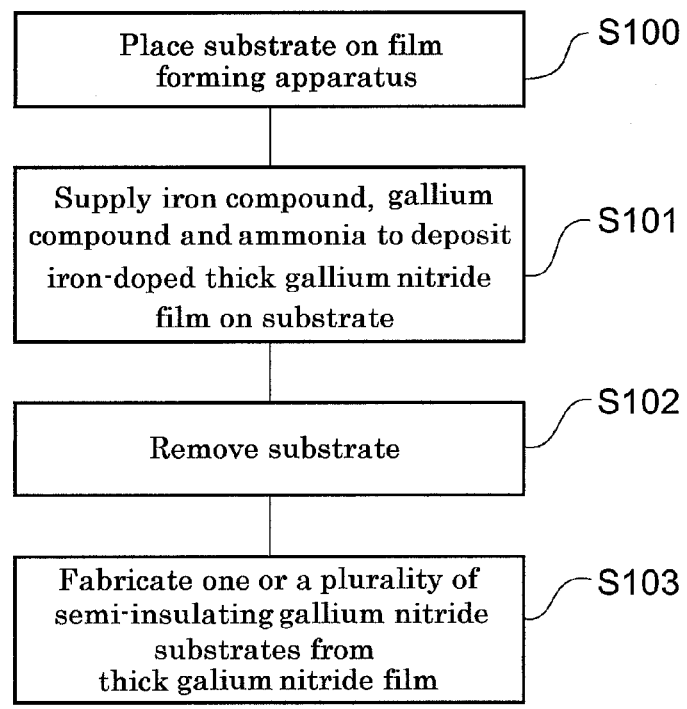
FIG. 1A is a operational chart illustrating a method of forming according to a first embodiment of the present invention gallium nitride into which iron has been introduced.

The findings of the present invention will be easily understood from the following detailed description with reference to the accompanying illustrative drawings. Hereinafter, a semi-insulating substrate for an electronic device according to an embodiment of the present invention and a method of fabricating the substrate will be described with reference to the drawings. Where possible, the same reference numerals refer to the same parts.

FIRST EMBODIMENT

FIG. 1A is a flowchart illustrating a method involving a first embodiment of the present invention of producing gallium nitride into which iron has been introduced. Initially, in step S100, a substrate is placed on a support in a reaction apparatus. Usable substrates include, for example, a sapphire substrate having a (0001) face can be used. Instead of this substrate, a SiC substrate having a (0001) face, a GaAs substrate having a (111) face, a GaP substrate having a (111) face, an InP substrate having a (111) face.

Next, in step S101, an iron compound, a gallium compound, and ammonia are supplied into a reaction furnace to form a thick gallium nitride film on the substrate. With iron being introduced into the thick gallium nitride film, it exhibits semi-insulative properties. This film is grown by hydride VPE or metalorganic hydrogen chloride VPE.

According to this method, the iron compound is used without using metallic iron, making it possible to prevent impurities other than iron from being introduced into the gallium nitride region concomitantly with the iron doping. Since iron chloride is supplied as a dopant in the film growing process using hydride VPE or metalorganic hydrogen chloride VPE, iron droplets generation is minimal, furthering the provision of iron dopant to the epitaxial region. Therefore, a thick gallium nitride film having satisfactory semi-insulative properties is formed utilizing hydride VPE or metalorganic hydrogen chloride VPE.

As the iron compound, organometallic iron is preferably used. For example, after organometallic iron is caused to react with hydrogen chloride in a mixing container in advance, gas from the reaction product is supplied into a reaction furnace. The reaction product includes iron chloride. As the organometallic iron, at least one of $Cp_2Fe$ (bis(cyclopentadienyl)iron, chemical formula: $(C_5H_5)_2Fe$) and $MeCp_2Fe$ (bis(methylcyclopentadienyl)iron, chemical formula: $(CH_3C_5H_4)_2Fe$) is preferably used.

The thick gallium nitride film has a thickness of 100 micrometers or more, preferably 400 micrometers or more. The thick gallium nitride film preferably has an iron concentration of $5 \times 10^{16}$ $cm^{-3}$ or more. The thick gallium nitride film having such an iron concentration can be used for semiconductor device fabrication, and can be used for a semi-insulating gallium nitride baseplate. The thick gallium nitride film preferably has a resistivity of $1 \times 10^5 \Omega \cdot cm$ or more. With this thick film, a gallium nitride baseplate that can be used for semiconductor device fabrication and has a resistivity of $1 \times 10^5$ $\Omega \cdot cm$ or more can be fabricated. More preferably, the thick gallium nitride film has a resistivity of $1 \times 10^7$ $\Omega \cdot cm$ or more. With this thick film, a gallium nitride baseplate that can be used for semiconductor device fabrication and has a resistivity of $1 \times 10^7$ $\Omega \cdot cm$ or more can be fabricated. The thick gallium nitride film preferably has an iron concentration of $1 \times 10^{21}$ $cm^{-3}$ or less. When the iron concentration of the thick gallium nitride film is $1 \times 10^{21}$ $cm^{-3}$ or less, reduction in resistivity and degradation in crystallinity due to the introduction of a large amount of iron are eliminated. If the concentration of iron in the gallium nitride baseplate crystal is $1 \times 10^{17}$ $cm^{-3}$ or more but $1 \times 10^{21}$ $cm^{-3}$ or less, a high-quality and high-resistivity gallium nitride baseplate of $1 \times 10^7 \Omega \cdot cm$ or more is obtained. Providing one or a plurality of III nitride films on this gallium nitride baseplate affords an epitaxial substrate that is suitable for gallium nitride electronic devices.

Figure 1B:
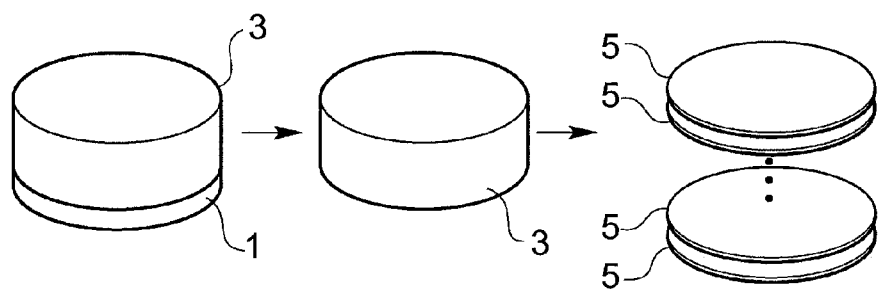
FIG. 1B is a diagram illustrating a procedure for fabricating a gallium nitride baseplate from a thick bulk gallium nitride film.

Next, in step S102, a thick gallium nitride film 3 is separated from a substrate 1 as illustrated in FIG. 1B. A freestanding thick gallium nitride film is obtained.

Thereafter, in step S103, as illustrated in FIG. 1B, the thick gallium nitride film 3 is subjected to at least one of either a slicing or a polishing process, thereby fabricating one or a plurality of gallium nitride baseplates 5 from the thick gallium nitride film 3. Each gallium nitride baseplate has a thickness of no less than 100 micrometers. A semi-insulating GaN substrate throughout which iron is introduced is provided. This semi-insulating substrate can be used for fabrication of electronic devices, such as field effect transistors, formed of a semiconductor gallium-nitride compound.

Figure 1C:
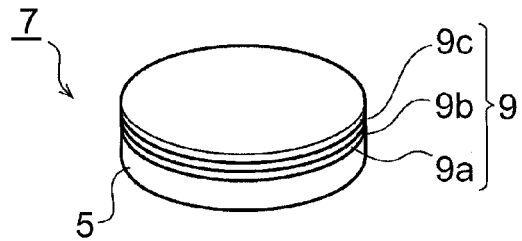
FIG. 1C is a diagram illustrating an epitaxial substrate used in a semi-insulating gallium nitride baseplate.

FIG. 1C is a diagram illustrating an epitaxial substrate 7 using a semi-insulating gallium nitride baseplate. The epitaxial substrate 7 comprises a gallium nitride baseplate 5 having an iron concentration of $5 \times 10^{16}$ $cm^{-3}$ or more and a thickness of 100 micrometers or more, and one or a plurality of III nitride films 9, provided on the gallium nitride baseplate 5. If the substrate 5 has a thickness of 100 micrometers or more, the substrate 5 can be utilized as a substrate in electronic device fabrication, and has a sufficient strength as an underlying layer. If the substrate 5 has an iron concentration of $5 \times 10^{16}$ $cm^{-3}$ or more, the substrate 5 can be utilized as a substrate in electronic device fabrication, and can reduce stray capacitance. In a preferable example, a III nitride film 9a, a III nitride film 9b, and a III nitride film 9c are each $Al_xIn_yGa_{1-x-y}N$ ($0 \leq x \leq 1$, $0 \leq y \leq 1$).

In accordance with this embodiment as described above, a method of forming for a semi-insulating GaN substrate gallium nitride, and a gallium nitride baseplate and an epitaxial substrate, into which iron has been introduced is provided.

SECOND EMBODIMENT

Figure 2:
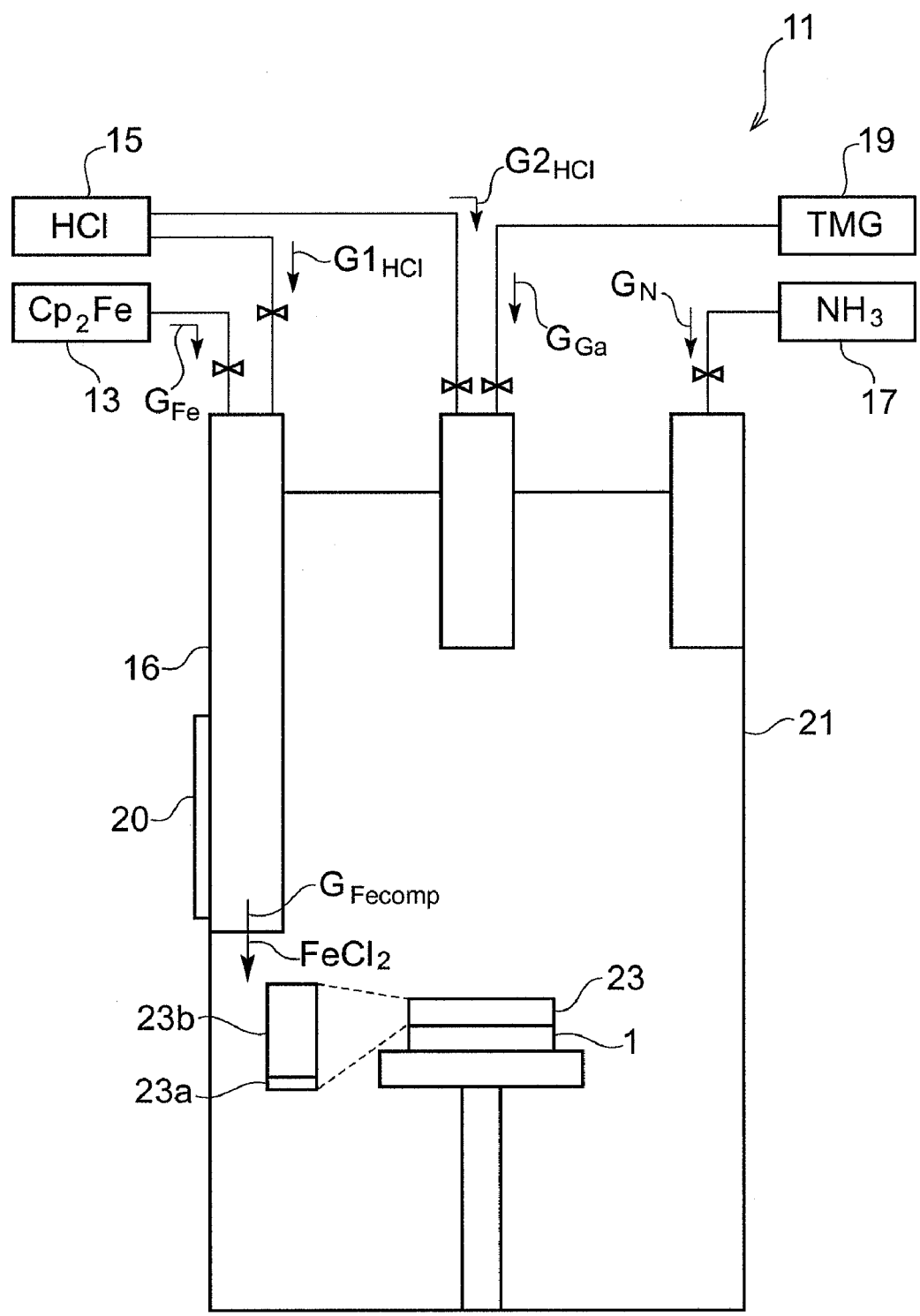
FIG. 2 is a diagram schematically illustrating an apparatus for using metalorganic hydrogen chloride vapor phase epitaxy to produce for a gallium nitride baseplate bulk gallium nitride into which iron has been introduced.

FIG. 2 is a diagram schematically illustrating an apparatus for utilizing metalorganic hydrogen chloride vapor phase epitaxy to produce for a gallium nitride baseplate bulk gallium nitride into which iron has been introduced.

Initially, a substrate 1, such as a sapphire substrate having a (0001) face, is placed on a susceptor of a metalorganic hydrogen chloride vapor phase apparatus 11. Next, gaseous iron compound $G_{Fe}$ from an iron compound source 13, such as ferrocene, and hydrogen chloride gas $G1_{HCl}$ from a hydrogen chloride source 15 are caused to react with each other in a mixing container 16, thereby generating iron-containing reaction product gas $G_{FeComp}$, such as iron chloride ($FeCl_2$). A heater 20 (including a temperature controller) is attached to the mixing container 16. Along with the production of the reaction product gas, the reaction product $G_{FeComp}$, a first substance gas $G_N$ containing elemental nitrogen from a nitride source 17, and a second substance gas $G_{Ga}$ containing elemental gallium, are supplied into a reaction tube 21 to form on the substrate 1 gallium nitride 23 into which iron has been introduced.

According to this method, the reaction product $G_{FeComp}$ containing iron is generated from the gaseous iron compound $G_{Fe}$ and the hydrogen chloride gas $G1_{HCl}$ before supply of the precursor gases $G_{Fe}$, $G_{Ga}$, and $G_N$ into the reaction tube 21. Therefore, generation of iron droplets in the reaction tube 21 is minimized, making it possible to supply an iron dopant into the epitaxial region 23. Since an iron compound is used without using metallic iron, it is possible to prevent impurities other than iron from being introduced into the gallium nitride region concomitantly with the iron doping. In a preferable example, the epitaxy apparatus 11 is a metalorganic hydrogen chloride VPE apparatus in which an organometallic is used as the Group III substance, and ammonia ($NH_3$), which is a hydrogen compound, is used as the Group V substance.

As the gallium material, organometallic gallium, such as trimethyl gallium, which is held in a container with a thermoregulator for keeping temperature constant, is transported into the reaction tube 21 using a carrier gas (e.g., hydrogen gas). Hydrogen chloride gas $G2_{HCl}$ is introduced into the reaction tube 21 in parallel with the gallium material. From trimethyl gallium and hydrogen chloride, gallium chloride is generated by the following chemical reaction.

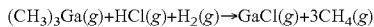

The gallium chloride gas is supplied into the reaction tube 21.

Ammonia gas is introduced into the reaction tube 21. Ammonia reacts with gallium chloride to generate gallium nitride by the following chemical reaction.

The gallium nitride is deposited on the substrate 1.

As the iron material, an organometallic iron such as ferrocene, which is held in a container with a thermoregulator for keeping temperature constant, is transported into the reaction tube 21 using a carrier gas (e.g., hydrogen gas or a mixture of hydrogen gas and an inert gas). In a mixing container 16 provided along the transport path, ferrocene reacts with hydrogen chloride to generate iron chloride according to the following chemical reaction.

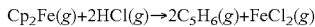

The iron chloride, which serves as an iron dopant, is transported immediately above the substrate 1.

In one example, the iron-doped thick gallium nitride film 23 is grown on a sapphire substrate having a (0001) face. Initially, a GaN buffer layer 23a having a thickness of about 50 nanometers is grown on the sapphire substrate at as low as 500 Celsius degrees. After the temperature is raised to 1000 Celsius degrees, a thick bulk GaN film 23b is grown for about one hour. An example is as follows.

GaN buffer layer 23a:
TMG partial pressure $P_{TMG}$=81.06 Pa ($8\times10^{-4}$ atm)
hydrogen chloride partial pressure $P_{HCl}$=81.1 Pa ($8\times10^{-4}$ atm)
ammonia partial pressure $P_{NH3}$=16200 Pa (0.16 atm)
Bulk thick GaN film 23b:
TMG partial pressure $P_{TMG}$=304 Pa ($3\times10^{-3}$ atm)
hydrogen chloride partial pressure $P_{HCl}$=304 Pa ($3\times10^{-3}$ atm)
ammonia partial pressure $P_{NH3}$=15200 Pa (0.15 atm)

The iron precursor—that is, ferrocene—is defined by the parameter PCp2Fe/PTMG.

Instead of the sapphire substrate, a GaAs substrate, a GaP substrate, an InP substrate, a SiC substrate, or the like may be used. Growth conditions for use of these substrates are substantially the same as those for the above-described sapphire substrate, except that the growth temperatures of the GaN buffer layer and the bulk GaN layer are 550 Celsius degrees and 920 Celsius degrees, respectively.

In a preferable example, the organometallic gallium, such as trimethyl gallium, has a partial pressure $P_{TMG}$ in the range of 50.7 Pa ($5\times10^{-4}$ atm) or more and 5070 Pa ($5\times10^{-2}$ atm) or less. Within this range, high-speed growth suitable for bulk growth can be achieved.

The partial pressure $P_{HCl}$ of hydrogen chloride is preferably in the range of 50.7 Pa ($5\times10^{-4}$ atm) or more and 5070 Pa ($5\times10^{-2}$ atm) or less. Within this range, in order to stabilize the reaction, it is preferable that the partial pressure $P_{HCl2}$ and the partial pressure $P_{TMG}$ be the same supply partial pressure, and the partial pressure $P_{HCl1}$ and the partial pressure $P_{Cp2Fe}$ be the same supply partial pressure.

The partial pressure $P_{NH3}$ of ammonia is preferably in the range of 1010 Pa ($1\times10^{-2}$ atm) or more and 50700 Pa ($5\times10^{-1}$ atm) or less.

A film formation temperature suitable for formation of a thick bulk gallium nitride film is preferably in the range of 920 Celsius degrees or more and 1100 Celsius degrees or less. Within this range, a high-quality GaN epitaxial layer with fewer crystal defects is obtained.

The reaction of organometallic iron, such as ferrocene, and hydrogen chloride is preferably conducted in the range of 300 Celsius degrees or more. If the temperature is excessively lower than this range, the reaction rate is low, resulting in insufficient generation of iron chloride. As a result, iron droplets occur in the reaction tube 21.

In this embodiment, as the organometallic iron, at least one of $Cp_2Fe$ (bis(cyclopentadienyl)iron, chemical formula: $(C_5H_5)_2Fe$) and $MeCp_2Fe$ (bis(methylcyclopentadienyl)iron, chemical formula: $(CH_3C_5H_4)_2Fe$) is preferably used.

Even when a carrier gas substantially consisting of $H_2$ gas is used so as to cause the organometallic iron, ferrocene, and HCl to react with each other, Fe droplets are not likely to occur. In addition, when such carrier gas is used, the degree of convection in the reaction furnace is small compared with nitrogen gas. Therefore, the uniformity (that is, the surface morphology) of the grown film is improved. $H_2$ gas having a higher purity than that of nitrogen gas is available.

The ratio ($P_{Fe}/P_{Ga}$) of the partial pressure ($P_{Fe}$) of the organometallic iron, ferrocene, to the partial pressure ($P_{Ga}$) of the gallium source gas, trimethyl gallium, is preferably 0.01 or more. Within this partial pressure range, reduction in resistivity and degradation in crystallinity due to the introduction of a large amount of iron are eliminated.

Using the thick bulk GaN film thus grown, one or a plurality of semi-insulating gallium nitride baseplates can be fabricated as described in the first embodiment. In addition, an epitaxial substrate comprising one or a plurality of III nitride films (an $Al_xIn_yGa_{1-x-y}N$ film, ($0 \leq x \leq 1$, $0 \leq y \leq 1$)) provided on this semi-insulating gallium nitride baseplate is provided.

As described above, according to this embodiment, a method of producing, for a semi-insulating GaN substrate, a gallium nitride baseplate, and an epitaxial substrate, gallium nitride into which iron has been introduced is provided.

THIRD EMBODIMENT

Figure 3:
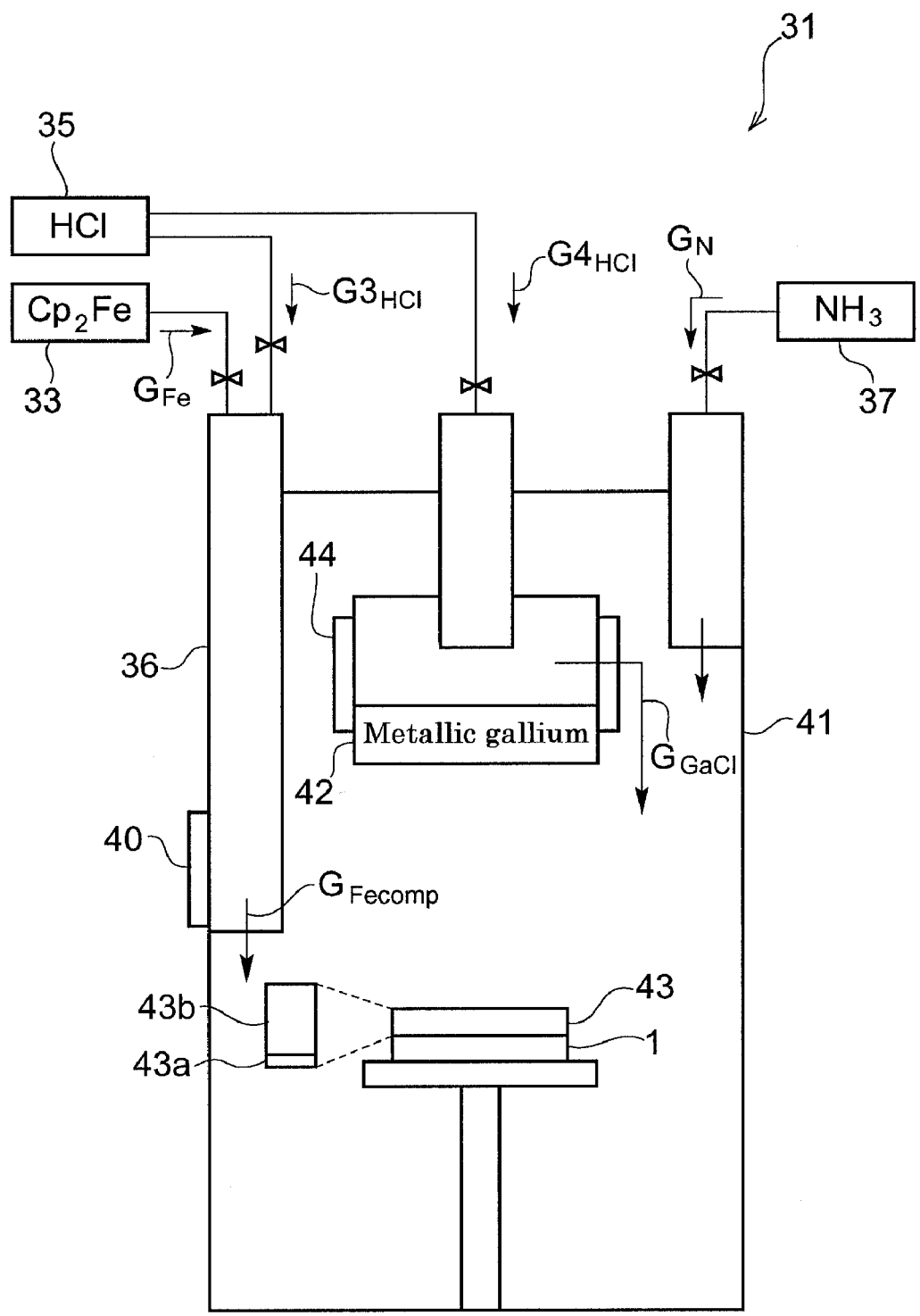
FIG. 3 is a diagram schematically illustrating an apparatus for using hydride VPE to produce for a gallium nitride baseplate bulk gallium nitride into which iron has been introduced.

FIG. 3 is a diagram schematically illustrating an apparatus for utilizing hydride VPE to produce for a gallium nitride baseplate bulk gallium nitride into which iron has been introduced.

Initially, a substrate 1, such as a sapphire substrate having a (0001) face, is placed on a susceptor of a hydride VPE apparatus 31. Next, gaseous iron compound $G_{Fe}$ from an iron compound source 33, such as ferrocene, and hydrogen chloride gas $G3_{HCl}$ from a hydrogen chloride source 35 are reacted with each other in a mixing container 36, thereby generating iron-containing reaction product gas $G_{FeComp}$, such as iron chloride ($FeCl_2$). A heater 40 (including a temperature controller) is attached to the mixing container 36.

In the reaction tube 41, metal gallium (Group III substance) is held in a container 42, such as a source boat. Hydrogen chloride gas $G4_{HCl}$ is supplied from the hydrogen chloride source 35 into the container 42. The container 42 is heated using a heater 44. When the hydrogen chloride gas $G4_{HCl}$ is passed on the metal gallium, gallium chloride (GaCl) is generated by the following chemical reaction.

$$2Ga(l)+2HCl(g) \rightarrow 2GaCl(g)+H_2(g)$$

The temperature of the source boat is held at 800 Celsius degrees or more using the heater 44.

In addition to the reaction product $G_{FeComp}$ and gallium chloride $G_{GaCl}$, first substance gas $G_N$ containing an nitrogen element is supplied from a nitrogen source 37 into the reaction tube 41. When ammonia gas is introduced into the reaction tube 41, ammonia reacts with gallium chloride by the following chemical reaction, so that iron-doped gallium nitride 43 is deposited on the substrate 1.

$$GaCl(g)+NH_3(g) \rightarrow GaN(s)+HCl(g)+H_2(g)$$

As the iron material, organometallic iron, such as ferrocene, that is held in a container with a thermoregulator for keeping temperature constant, is transported into the reaction tube 41 using carrier gas (e.g., hydrogen gas or a mixture of hydrogen gas and inert gas). Ferrocene reacts with hydrogen chloride to generate iron chloride in the mixing container 36 provided on the way to the reaction tube 41 by the following chemical reaction.

$$Cp_2Fe(g)+2HCl(g) \rightarrow 2C_5H_6(g)+FeCl_2(g)$$

The iron chloride, which serves as an iron dopant, is transported immediately above the substrate 1.

According to this method, the reaction product $G_{FeComp}$ containing iron is generated from the gaseous iron compound $G_{Fe}$ and the hydrogen chloride gas $G3_{HCl}$ before supply of the precursor gas $G_{Fe}$, $G_{Ga}$, and $G_N$ into the reaction tube 41. Therefore, generation of iron droplets in the reaction tube 41 is suppressed to a low level, thereby making it possible to supply an iron dopant to the epitaxial region 43. Since an iron compound is used without using metallic iron, it is possible to prevent an impurity other than iron from being doped into a gallium nitride region concomitantly with iron doping.

The epitaxy apparatus 31 is a hydride VPE apparatus in which metal gallium is used as a III-group material and ammonia ($NH_3$), which is a hydrogen compound, is used as a V-group material.

In an example, the iron-doped thick gallium nitride film 43 is grown on a sapphire substrate having a (0001) face. Initially, a GaN buffer layer 43a having a thickness of about 50 nanometers is grown on the sapphire substrate at as low as 500 Celsius degrees. After the temperature is raised to 1000 Celsius degrees, a thick bulk GaN film 43b is grown for about one hour. An example is as follows.

GaN buffer layer 43a:
hydrogen chloride partial pressure $P_{HCl}$=81.16 Pa ($8 \times 10^{-4}$ atm)
ammonia partial pressure $P_{NH3}$=16200 Pa (0.16 atm)

Bulk thick GaN film 43b:
hydrogen chloride partial pressure $P_{HCl}$=304 Pa ($3 \times 10^{-3}$ atm)
ammonia partial pressure $P_{NH3}$=15200 Pa (0.15 atm).

The iron material, such as ferrocene, is specified by a parameter $P_{Cp2Fe}/P_{GaCl}$.

As is similar to the foregoing embodiments, instead of the sapphire substrate, a GaAs substrate, a GaP substrate, an InP substrate, a SiC substrate, or the like may be used. Growth conditions for use of these substrates are substantially the same as those for the above-described sapphire substrate, except that the growth temperatures of the GaN buffer layer and the bulk GaN layer are 550 Celsius degrees and 920 Celsius degrees, respectively.

A film formation temperature suitable for formation of a thick bulk gallium nitride film is preferably in the range of 920 Celsius degrees or more and 1100 Celsius degrees or less. Within this range, a high-quality GaN epitaxial layer with less crystal defects is obtained.

The partial pressure $P_{HCl}$ of hydrogen chloride is preferably in the range of 50.7 Pa ($5 \times 10^{-4}$ atm) or more and 5070 Pa ($5 \times 10^{-2}$ atm) or less.

The partial pressure $P_{NH3}$ of ammonia is preferably in the range of 1010 Pa ($1 \times 10^{-2}$ atm) or more and 50700 Pa ($5 \times 10^{-1}$ atm) or less.

The reaction of organometallic iron, ferrocene, and hydrogen chloride is preferably conducted in the range of 300 Celsius degrees or more. If the temperature is excessively lower than this range, the reaction rate is low, resulting in insufficient generation of iron chloride and leading to the occurrence of iron droplets in the reaction tube.

Also in this embodiment, as the organometallic iron, at least one of $Cp_2Fe$ (bis(cyclopentadienyl)iron, chemical formula: $(C_5H_5)_2Fe$) and $MeCp_2Fe$ (bis(methylcyclopentadienyl)iron, chemical formula: $(CH_3C_5H_4)_2Fe$) is preferably used.

Even when carrier gas substantially consisting of $H_2$ gas is used so as to cause the organometallic iron, ferrocene, and HCl to react with each other, Fe droplets are not likely to occur. In addition, when such carrier gas is used, the degree of convection in the reaction furnace is small compared to nitrogen gas. Therefore, the uniformity (e.g., surface morphology) of a grown film is improved. $H_2$ gas having a higher purity than that of nitrogen gas is available.

The ratio ($P_{Fe}/P_{Ga}$) of the partial pressure ($P_{Fe}$) of organometallic iron, such as ferrocene, to the partial pressure ($P_{Ga}$) of gas of a gallium source, such as gallium chloride, is preferably 0.01 or more. Within this partial pressure range, a GaN epitaxial layer having a high resistivity is obtained without a reduction in the amount of iron taken into the epitaxial layer.

Using the thick bulk GaN film thus grown, one or a plurality of semi-insulating gallium nitride baseplates can be fabricated as described in the first embodiment. In addition, an epitaxial substrate comprising one or a plurality of III nitride films (an $Al_xIn_yGa_{1-x-y}N$ film, ($0 \leq x \leq 1$, $0 \leq y \leq 1$)) provided on this semi-insulating gallium nitride baseplate is provided.

As described above, according to this embodiment, a method of producing, for a semi-insulating GaN substrate, a gallium nitride baseplate, and an epitaxial substrate, gallium nitride into which iron has been introduced is provided.

Figure 4:
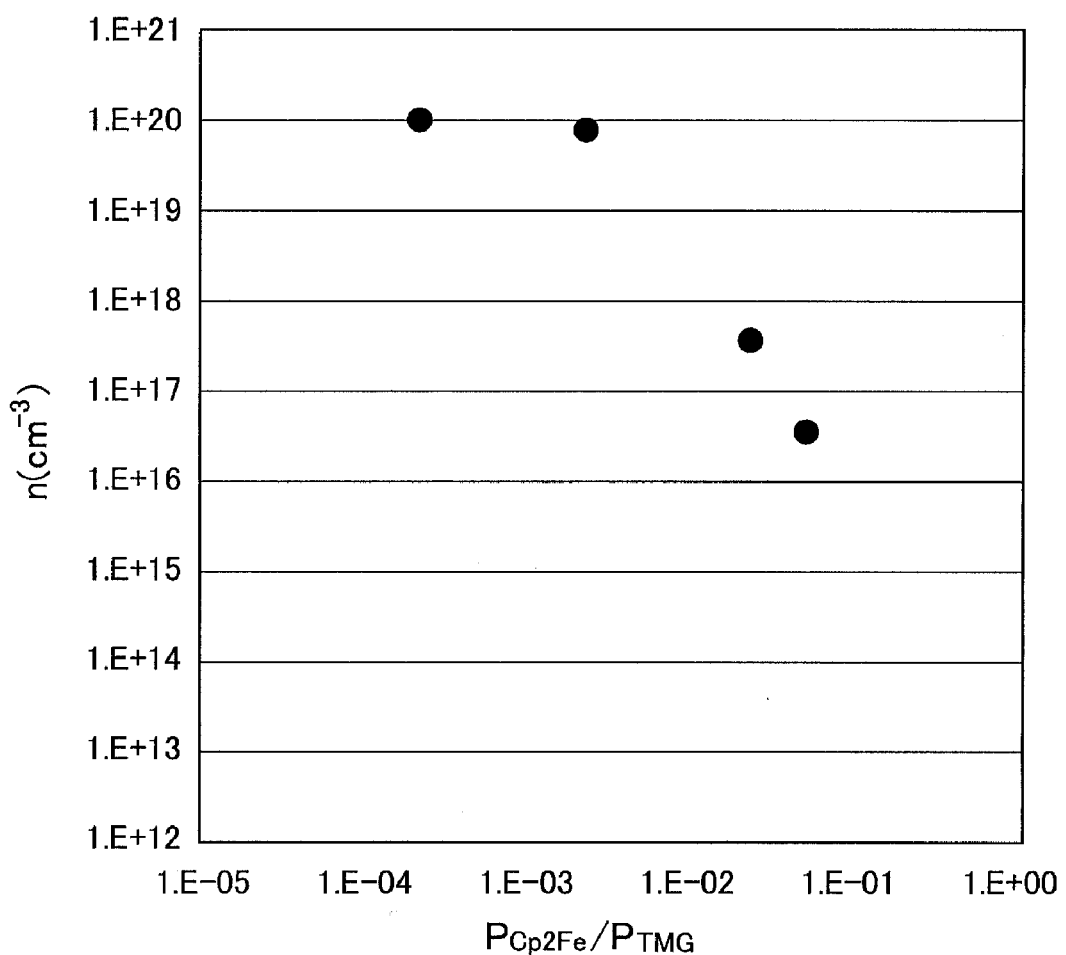
FIG. 4 is a graph showing n-type carrier concentration in a thick gallium nitride film grown according to a second embodiment of the present invention.
Figure 5:
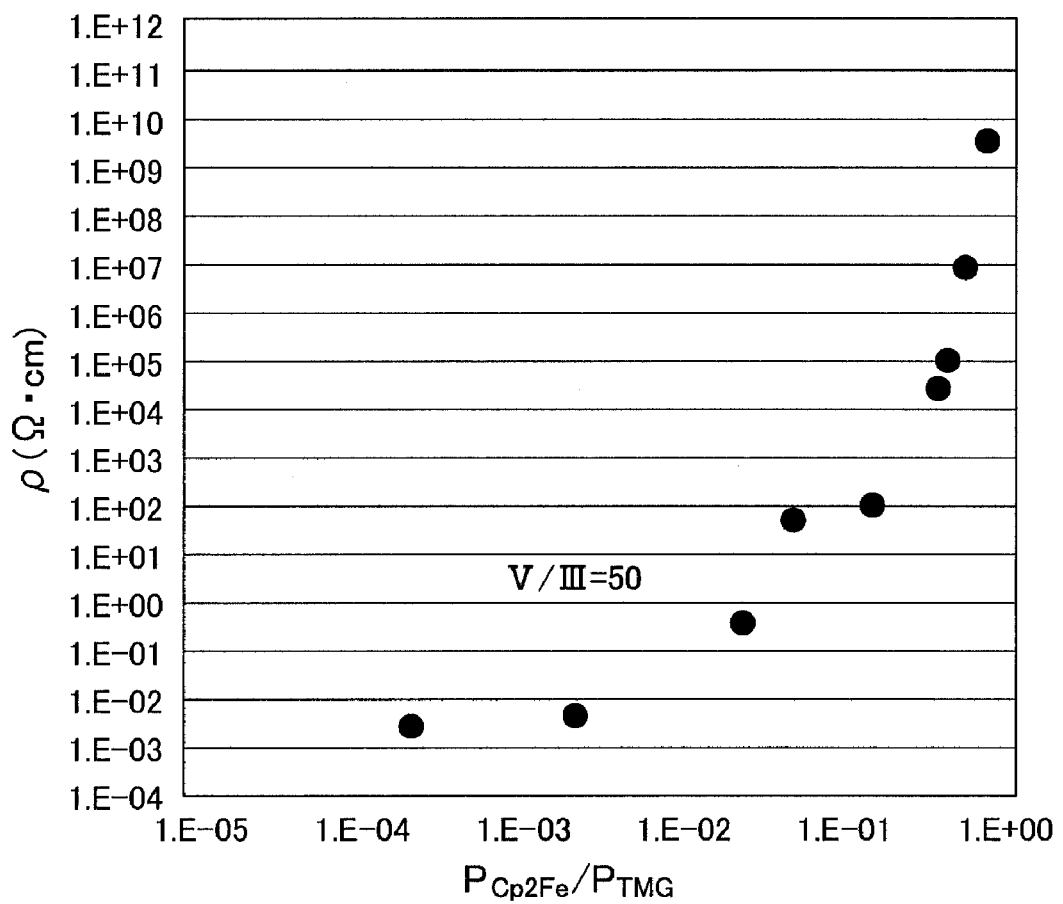
FIG. 5 is a graph showing resistivity of the thick gallium nitride film grown according to the second embodiment.

FIG. 4 is a graph plotting the n-type carrier concentration in a thick gallium nitride film grown according to the second embodiment. FIG. 5 is a graph plotting the resistivity of the thick gallium nitride film grown according to the second embodiment. The horizontal axis indicates the partial pressure ratio ($P_{Cp2Fe}/P_{TMG}$) of ferrocene to trimethyl gallium. As shown in FIG. 4, as the amount of an iron dopant is increased, the n-type carrier concentration decreases. Also, as the supply partial pressure ratio is increased, the resistivity increases. When $P_{Cp2Fe}/P_{TMG}$=0.68, the resistivity is $3 \times 10^9$ Ω·cm. Since a resistivity of $1 \times 10^7$ Ω·cm or more is required for substrates for electronic devices, $P_{Cp2Fe}/P_{TMG}$ is preferably 0.5 or more. An undoped GaN film, on which iron doping using ferrocene has not been performed, has a carrier concentration of $1.6 \times 10^{20}$ cm$^{-3}$ and a resistivity of $2.7 \times 10^{-3}$ Ω·cm. The gallium nitride film has a growth rate of about 12 micrometers per minute. Substantially no change in the growth rate depending on the presence or absence of iron doping is observed.

Figure 6:
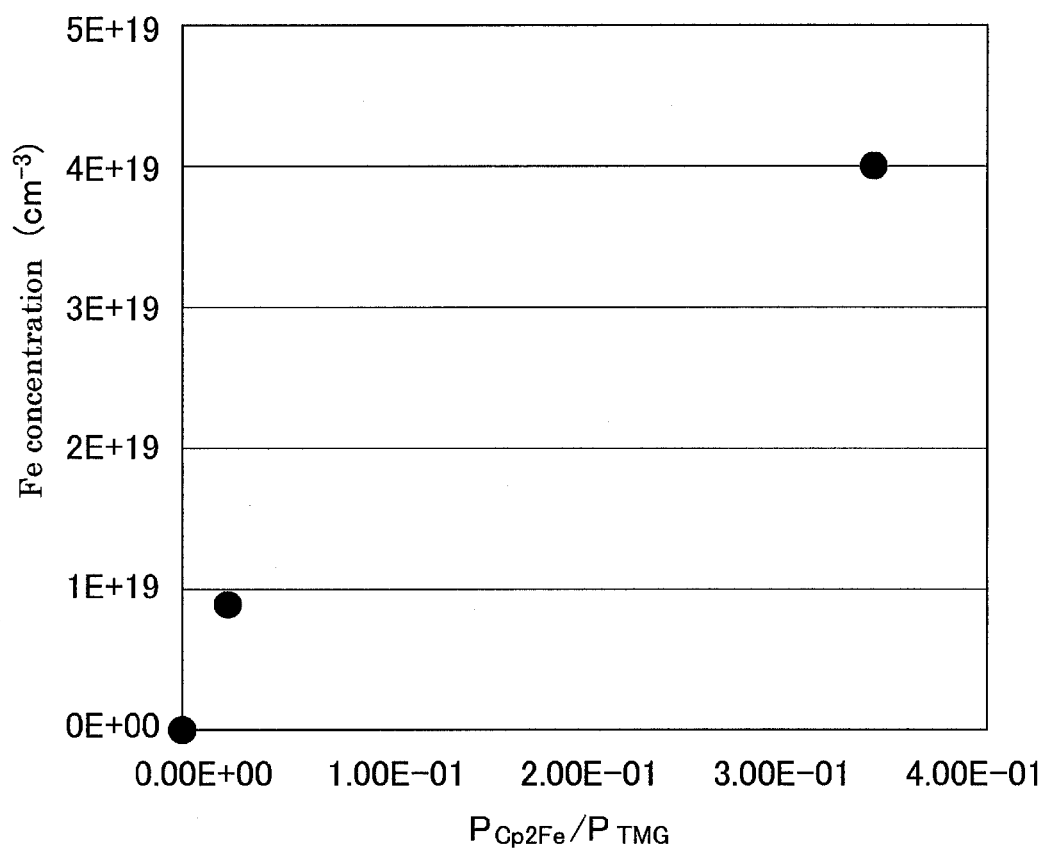
FIG. 6 is a graph showing iron concentration in the gallium nitride film.

FIG. 6 is a graph showing an iron concentration of the gallium nitride film. The iron concentration is determined by SIMS analysis. A gallium nitride film which is grown without addition of ferrocene has an iron concentration which is under the limit of detection. When $P_{Cp2Fe}/P_{TMG}=2.3\times10^{-2}$, the iron concentration is $9\times10^{18}$ cm$^{-3}$. When $P_{Cp2Fe}/P_{TMG}=3.4\times10^{-1}$, the iron concentration is $4\times10^{19}$ cm$^{-3}$.

When a GaAs substrate is used instead of a sapphire substrate, $P_{Cp2Fe}/P_{TMG}=2.3\times10^{-2}$ and the iron concentration is $5\times10^{18}$ cm$^{-3}$. Therefore, it is considered that there is substantially no difference in iron concentration depending on the substrate type.

As described above, it is possible to stably perform iron doping using organometallic iron, such as ferrocene, thereby forming bulk gallium nitride for a high-resistance gallium nitride baseplate. This semi-insulating gallium nitride baseplate can be used to fabricate a high-speed and high-breakdown-voltage electronic device.

While the underlying principle of the invention has been illustrated and described by way of preferred embodiments, it will be understood by those skilled in the art that modifications and variations can be made in arrangements and details without departing from the principle of the invention. The invention is not limited to the specific structures disclosed in the above-described embodiments. All variations and modifications falling within the scope and spirit of the appended claims are intended to be embraced therein.

What is claimed is:

1. A method of forming, by organometallic hydrogen chloride VPE, iron-doped gallium nitride for a gallium nitride baseplate, comprising the steps of:

forming a reaction product containing iron by reacting, at a temperature of at least 300° C., gaseous ferrocene or dimethylferrocene with hydrogen chloride gas; and supplying into a reaction tube the reaction product gas entrained in $H_2$ gas is used as a carrier gas, together with a first gas containing elemental nitrogen, and a second gas containing elemental gallium, with the ratio ($P_{Fe}/P_{Ga}$) of the partial pressure ($P_{Fe}$) of the reaction product gas to the partial pressure ($P_{Ga}$) of the second gas being at least 0.5, so as to form on a substrate a gallium nitride region into which iron has been introduced.

* * * * *